United States Patent
Shima et al.

(10) Patent No.: US 7,075,052 B2
(45) Date of Patent: Jul. 11, 2006

(54) PHOTOELECTRIC CONVERSION DEVICE

(75) Inventors: Masaki Shima, Uji (JP); Shigeharu Taira, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 322 days.

(21) Appl. No.: 10/663,663

(22) Filed: Sep. 17, 2003

(65) Prior Publication Data

US 2004/0065807 A1   Apr. 8, 2004

(30) Foreign Application Priority Data

Oct. 8, 2002  (JP) .............................. 2002-294635

(51) Int. Cl.
 *H01L 31/00* (2006.01)
 *H01L 31/036* (2006.01)

(52) U.S. Cl. .................. 250/214.1; 257/627; 257/431; 257/290

(58) Field of Classification Search ............. 250/214.1; 257/70, E31.04, E31.045, 257, 258, 290, 257/291, 627, 628
See application file for complete search history.

(56) References Cited

U.S. PATENT DOCUMENTS

| | | | |
|---|---|---|---|
| 4,433,202 A | 2/1984 | Maruyama et al. | |
| 5,007,971 A | 4/1991 | Kanai et al. | |
| 6,103,138 A | 8/2000 | Kondo | |
| 6,200,825 B1 * | 3/2001 | Yoshimi et al. | 438/24 |
| 2002/0005519 A1 | 1/2002 | Muramatsu et al. | |

FOREIGN PATENT DOCUMENTS

| | | |
|---|---|---|
| EP | 1 032 052 A1 | 8/2000 |
| EP | 1 241 711 A2 | 9/2002 |
| JP | 9-307130 | 11/1997 |
| JP | 11-266030 | 9/1999 |
| JP | P2001-284619 A | 10/2001 |
| JP | P2002-9312 A | 1/2002 |
| JP | P2002-16271 A | 1/2002 |
| JP | P2002-33499 A | 1/2002 |
| JP | P2002-33500 A | 1/2002 |
| JP | P2002-76396 A | 3/2002 |
| JP | P2002-198551 A | 7/2002 |

OTHER PUBLICATIONS

"Thin Film Crystalline Silicon Solar Cell," Kenji Yamamoto, Oyo Buturi, vol. 71, pp. 522-528 (2002).

* cited by examiner

*Primary Examiner*—Thanh X. Luu
*Assistant Examiner*—Stephen Yam
(74) *Attorney, Agent, or Firm*—McDermott Will & Emery LLP (57) ABSTRACT

A photoelectric conversion device capable of improving an open-circuit voltage is obtained. In this photoelectric conversion device, many of crystal grains contained in a third non-single-crystalline semiconductor layer have major axes substantially perpendicular to a main surface of a substrate on an interfacial portion between at least either a first non-single-crystalline semiconductor layer or a second non-single-crystalline semiconductor layer and the third non-single-crystalline semiconductor layer, and many of crystal grains contained in either semiconductor layer have major axes substantially parallel to the main surface of the substrate on the aforementioned interfacial portion.

18 Claims, 4 Drawing Sheets

PHOTOELECTRIC CONVERSION DEVICE

BACKGROUND OF THE INVENTION

1. Field of the Invention

The present invention relates to a photoelectric conversion device, and more particularly, it relates to a photoelectric conversion device employing a non-single-crystalline semiconductor such as a microcrystalline or polycrystalline semiconductor containing a large number of crystal grains as a photoelectric conversion layer.

2. Description of the Background Art

A photoelectric conversion device employing a microcrystalline silicon ($\mu$c-Si) semiconductor as a photoelectric conversion layer has recently been proposed in Japanese Patent Laying-Open No. 2001-284619 or 2002-76396. The term "microcrystalline silicon ($\mu$c-Si) semiconductor" denotes a semiconductor containing a large number of crystal grains having the maximum grain size of not more than about 100 nm while containing Si as the element, including that having an amorphous phase therein. The photoelectric conversion device employing microcrystalline silicon ($\mu$c-Si) as the photoelectric conversion layer is by far smaller in photo-deterioration as compared with a photoelectric conversion device consisting of amorphous silicon (a-Si).

Figure 6:
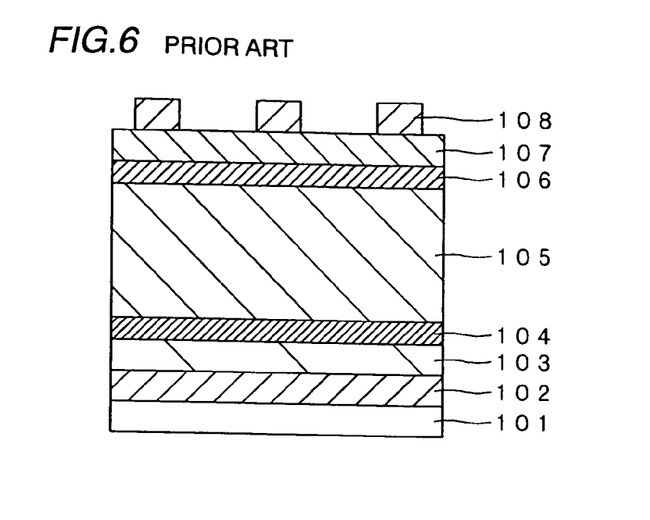
FIG. 6 is a sectional view for illustrating the structure of a conventional photoelectric conversion device.

FIG. 6 is a sectional view for illustrating the structure of a conventional photoelectric conversion device employing microcrystalline silicon ($\mu$c-Si) as a photoelectric conversion layer. The structure of the conventional photoelectric conversion device employing microcrystalline silicon ($\mu$c-Si) as a photoelectric conversion layer is now described with reference to FIG. 6.

In the conventional photoelectric conversion device, a metal electrode layer 102 of Ag having a thickness of about 300 nm is formed on the upper surface of a glass substrate 101, as shown in FIG. 6. A transparent electrode 103 of aluminum-doped zinc oxide (AZO) having a thickness of about 100 nm is formed on the upper surface of the metal electrode layer 102. A power generation unit obtained by successively stacking an n layer 104 (thickness: about 50 nm) consisting of microcrystalline silicon ($\mu$c-Si) doped with phosphorus, an i layer 105 (thickness: about 2 $\mu$m) consisting of microcrystalline silicon ($\mu$c-Si) substantially doped with no impurity for deciding the conductivity type and a p layer 106 (thickness: about 10 nm) consisting of microcrystalline silicon ($\mu$c-Si) doped with boron is formed on the upper surface of the transparent electrode 103. A transparent electrode 107 having a thickness of about 80 nm is formed on the power generation unit. A collector electrode 108 of silver paste are formed on prescribed portions of the upper surface of the transparent electrode 107. Thus constituted is the conventional photoelectric conversion device employing microcrystalline silicon ($\mu$c-Si) as a photoelectric conversion layer (the power generation unit).

Figure 7:
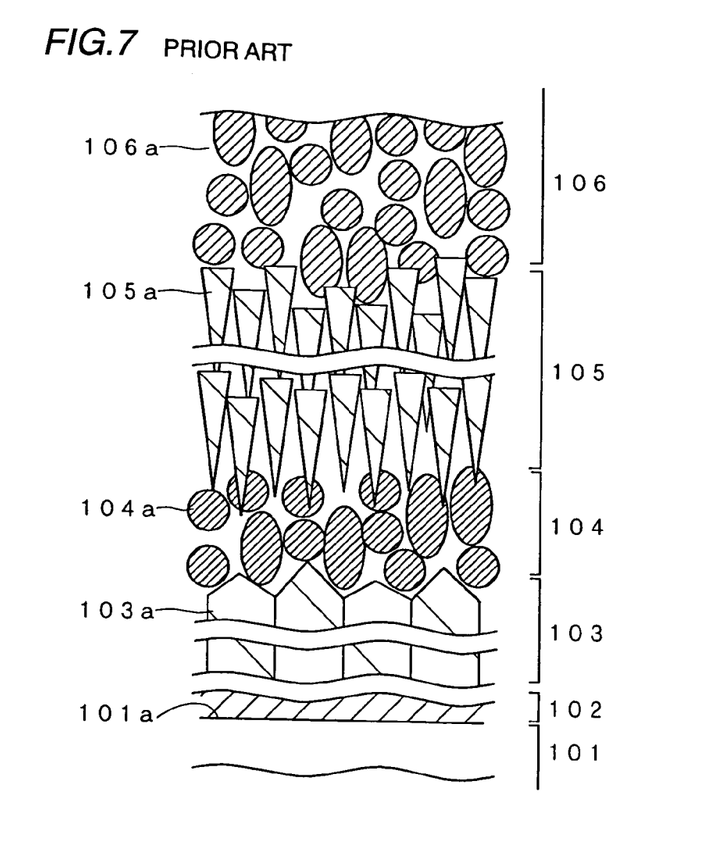
FIG. 7 is a schematic sectional view for illustrating the states of crystal grains contained in layers of the conventional photoelectric conversion device shown in FIG. 6.

FIG. 7 is a schematic sectional view for illustrating the states of crystal grains contained in the layers of the conventional photoelectric conversion device shown in FIG. 6. Referring to FIG. 7, many of crystal grains 105a contained in the i layer 105 have major axes substantially perpendicular to the main surface 101a of the substrate 101. Further, many of crystal grains 104a and 106a contained in the n layer 104 and the p layer 106 respectively have substantially isotropic shapes or major axes substantially perpendicular to the main surface 101a of the substrate 101. Thus, many of the crystal grains 104a, 105a and 106a contained in the n layer 104, the i layer 105 and the p layer 106 constituting the power generation unit are unidirectionally oriented substantially perpendicularly to the main surface 101a of the substrate 101. Further, many of crystal grains 103a contained in the transparent electrode 103 provided under the n layer 104 also have major axes substantially perpendicular to the main surface 101a of the substrate 101.

In the aforementioned conventional photoelectric conversion device employing microcrystalline silicon ($\mu$c-Si) as the photoelectric conversion layer (the power generation unit), however, the open-circuit voltage, which is an important output parameter thereof, is disadvantageously low.

SUMMARY OF THE INVENTION

An object of the present invention is to provide a photoelectric conversion device capable of improving its open-circuit voltage.

In order to attain the aforementioned object, the inventor has made deep studies to find out that it is possible to improve the open-circuit voltage by arranging major axes of crystal grains contained in a non-single-crystalline semiconductor layer constituting a photoelectric conversion layer along a prescribed direction.

A photoelectric conversion device according to a first aspect of the present invention comprises a substrate having a main surface, a first conductivity type first non-single-crystalline semiconductor layer formed on the main surface of the substrate, a second conductivity type second non-single-crystalline semiconductor layer formed on the main surface of the substrate and a substantially intrinsic third non-single-crystalline semiconductor layer formed between the first non-single-crystalline semiconductor layer and the second non-single-crystalline semiconductor layer. Many of crystal grains contained in the third non-single-crystalline semiconductor layer have major axes substantially perpendicular to the main surface of the substrate on an interfacial portion between at least either the first non-single-crystalline semiconductor layer or the second non-single-crystalline semiconductor layer. Further, many of crystal grains contained in either semiconductor layer have major axes substantially parallel to the main surface of the substrate on the aforementioned interfacial portion.

In the photoelectric conversion device according to the first aspect, as hereinabove described, many of the crystal grains contained in the third non-single-crystalline semiconductor layer are arranged to have major axes substantially perpendicular to the main surface of the substrate on the interface between at least either the first non-single-crystalline semiconductor layer or the second non-single-crystalline semiconductor layer and the third non-single-crystalline semiconductor layer while many of the crystal grains contained in either semiconductor layer are arranged to have major axes substantially parallel to the main surface of the substrate, whereby the crystal grains can be discontinuous on the interface between at least either the first non-single-crystalline semiconductor layer or the second non-single-crystalline semiconductor layer and the third non-single-crystalline semiconductor layer while the ratio of grain boundaries as viewed from either semiconductor layer can be reduced. Thus, a reverse leakage current is suppressed on the interface between at least either the first non-single-crystalline semiconductor layer or the second non-single-crystalline semiconductor layer and the third non-single-crystalline semiconductor layer, whereby the open-circuit voltage can be improved.

In the aforementioned photoelectric conversion device according to the first aspect, the average grain size of the crystal grains contained in either semiconductor layer in the direction parallel to the main surface of the substrate is preferably larger than the average grain size of the crystal grains contained in the third non-single-crystalline semiconductor layer in the direction parallel to the main surface of the substrate. According to this structure, crystal grains perpendicular to the main surface of the substrate can be improved in discontinuity on the interface between at least either the first non-single-crystalline semiconductor layer or the second non-single-crystalline semiconductor layer and the third non-single-crystalline semiconductor layer, whereby the reverse leakage current can be further suppressed. Thus, the open-circuit voltage can be improved.

In the aforementioned photoelectric conversion device according to the first aspect, the first non-single-crystalline semiconductor layer, the second non-single-crystalline semiconductor layer and the third non-single-crystalline semiconductor layer preferably consist of microcrystalline semiconductor layers. According to this structure, many of crystal grains contained in the third non-single-crystalline semiconductor layer can be easily arranged to have major axes substantially perpendicular to the main surface of the substrate on the interface between at least either the first non-single-crystalline semiconductor layer or the second non-single-crystalline semiconductor layer and the third non-single-crystalline semiconductor layer while many of crystal grains contained in either semiconductor layer can be arranged to have major axes substantially parallel to the main surface of the substrate. In this case, the first non-single-crystalline semiconductor layer, the second non-single-crystalline semiconductor layer and the third non-single-crystalline semiconductor layer preferably consist of microcrystalline silicon layers.

The aforementioned photoelectric conversion device according to the first aspect preferably further comprises an electrode layer formed between the substrate and either the first non-single-crystalline semiconductor layer or the second non-single-crystalline semiconductor layer to come into contact with either the first non-single-crystalline semiconductor layer or the second non-single-crystalline semiconductor layer, and many of crystal grains contained in the electrode layer preferably have major axes substantially perpendicular to the main surface of the substrate. According to this structure, the number of grain boundaries perpendicular to the main surface of the substrate is reduced and crystal grains are discontinuous also on the interface between the electrode layer and either the first non-single-crystalline semiconductor layer or the second non-single-crystalline semiconductor layer. Consequently, the reverse leakage current can be further suppressed, whereby the open-circuit voltage can be improved. In this case, the electrode layer may be a transparent electrode layer. Further, the transparent electrode layer may consist of AZO (aluminum-doped zinc oxide).

The aforementioned photoelectric conversion device according to the first aspect preferably includes at least one power generation unit having the first non-single-crystalline semiconductor layer, the second non-single-crystalline semiconductor layer and the third non-single-crystalline semiconductor layer. According to this structure, the number of grain boundaries perpendicular to the main surface of the substrate is reduced at least in one power generation unit also when the photoelectric conversion device has a multilayer structure obtained by stacking a plurality of power generation units, whereby the reverse leakage current can be suppressed. Consequently, the open-circuit voltage can be improved.

A photoelectric conversion device according to a second aspect of the present invention comprises a substrate having a main surface, a first conductivity type first non-single-crystalline semiconductor layer formed on the main surface of the substrate, a second conductivity type second non-single-crystalline semiconductor layer formed on the main surface of the substrate and a substantially intrinsic third non-single-crystalline semiconductor layer formed between the first non-single-crystalline semiconductor layer and the second non-single-crystalline semiconductor layer on the main surface of the substrate. At least either the first non-single-crystalline semiconductor layer or the second non-single-crystalline semiconductor layer includes a structure formed by stacking a first layer and a second layer containing many crystal grains having major axis directions substantially different from each other. Many of crystal grains contained in the first layer have major axes substantially parallel to the main surface of the substrate, and many of crystal grains contained in the second layer have major axes substantially perpendicular to the main surface of the substrate.

In the photoelectric conversion device according to the second aspect, as hereinabove described, at least either the first non-single-crystalline semiconductor layer or the second non-single-crystalline semiconductor layer is formed to include the structure obtained by stacking the first layer containing many crystal grains having major axes substantially parallel to the main surface of the substrate and the second layer containing many crystal grains having major axes substantially perpendicular to the main surface of the substrate so that the number of grain boundaries perpendicular to the main surface of the substrate is reduced and crystal grains are discontinuous on the interface between the first and second layers. Consequently, a reverse leakage current can be so suppressed as to improve an open-circuit voltage.

In the aforementioned photoelectric conversion device according to the second aspect, the first layer is preferably in contact with the third non-single-crystalline semiconductor layer, and many of crystal grains contained in the third non-single-crystalline semiconductor layer preferably have major axes substantially perpendicular to the main surface of the substrate. According to this structure, the number of grain boundaries perpendicular to the main surface of the substrate is reduced and crystal grains are discontinuous also on the interface between the first layer and the third non-single-crystalline semiconductor layer. Consequently, the reverse leakage current can be further suppressed for improving the open-circuit voltage.

In the aforementioned photoelectric conversion device according to the second aspect, the second layer may be in contact with the third non-single-crystalline semiconductor layer.

In the aforementioned photoelectric conversion device according to the second aspect, the average grain size of the crystal grains contained in the first layer in the direction parallel to the main surface of the substrate is preferably larger than the average grain size of the crystal grains contained in the second layer in the direction parallel to the main surface of the substrate. According to this structure, crystal grains perpendicular to the main surface of the substrate can be improved in discontinuity on the interface between the first and second layers. Thus, the reverse leakage current can be further suppressed, thereby improving the open-circuit voltage.

In the aforementioned photoelectric conversion device according to the second aspect, the first non-single-crystalline semiconductor layer, the second non-single-crystalline semiconductor layer and the third non-single-crystalline semiconductor layer preferably consist of microcrystalline semiconductor layers. According to this structure, at least either the first non-single-crystalline semiconductor layer or the second non-single-crystalline semiconductor layer can be formed to include the structure obtained by stacking the first layer containing many crystal grains having major axes substantially parallel to the main surface of the substrate and the second layer containing many crystal grains having major axes substantially perpendicular to the main surface of the substrate by controlling conditions for manufacturing the first and second non-single-crystalline semiconductor layers. In this case, the first non-single-crystalline semiconductor layer, the second non-single-crystalline semiconductor layer and the third non-single-crystalline semiconductor layer preferably consist of microcrystalline silicon layers.

The aforementioned photoelectric conversion device according to the second aspect preferably further comprises an electrode layer formed between the substrate and either the first non-single-crystalline semiconductor layer or the second non-single-crystalline semiconductor layer to come into contact with either the first non-single-crystalline semiconductor layer or the second non-single-crystalline semiconductor layer, and many of crystal grains contained in the electrode layer have major axes substantially perpendicular to the main surface of the substrate. According to this structure, the number of grain boundaries perpendicular to the main surface of the substrate is reduced and crystal grains are discontinuous also on the interface between the electrode layer and either the first non-single-crystalline semiconductor layer or the second non-single-crystalline semiconductor layer. Consequently, the reverse leakage current can be further suppressed, thereby improving the open-circuit voltage. In this case, the electrode layer may be a transparent electrode layer, and this transparent electrode layer may consist of AZO (aluminum-doped zinc oxide).

The aforementioned photoelectric conversion device according to the second aspect preferably includes at least one power generation unit having the first non-single-crystalline semiconductor layer, the second non-single-crystalline semiconductor layer and the third non-single-crystalline semiconductor layer. According to this structure, the number of grain boundaries perpendicular to the main surface of the substrate is reduced at least in one power generation unit also when the photoelectric conversion device has a multi-layer structure obtained by stacking a plurality of power generation units, whereby the reverse leakage current can be suppressed. Consequently, the open-circuit voltage can be improved.

In the present invention, the term "non-single-crystalline semiconductor layer" denotes a wide concept including a polycrystalline semiconductor layer, a microcrystalline semiconductor layer and an amorphous semiconductor layer, for example.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The overall structure of a photoelectric conversion device according to a first embodiment of the present invention is described with reference to FIG. 1.

Figure 1:
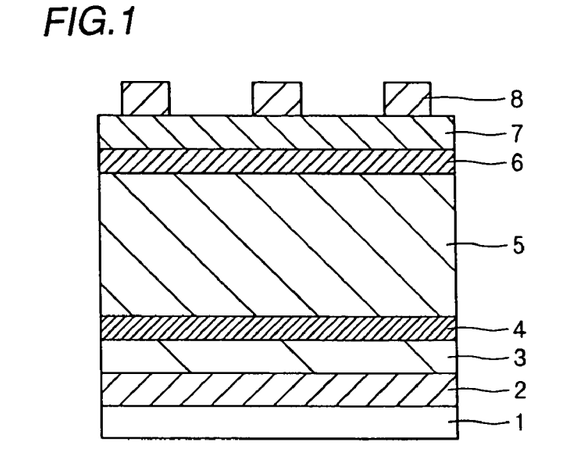
FIG. 1 is a sectional view showing a photoelectric conversion device according to a first embodiment of the present invention.

In the photoelectric conversion device according to the first embodiment, a metal electrode layer 2 of Ag having a thickness of about 300 nm is formed on the upper surface of a glass substrate 1, as shown in FIG. 1. A transparent electrode 3 of AZO (aluminum-doped zinc oxide) having a thickness of about 100 nm is formed on the upper surface of the metal electrode layer 2. The transparent electrode 3 is an example of the "electrode layer" in the present invention. A power generation unit obtained by successively stacking an n layer 4 (thickness: about 50 nm) consisting of microcrystalline silicon (μc-Si) doped with phosphorus, an i layer 5 (thickness: about 2 Mm) consisting of microcrystalline silicon (μc-Si) substantially doped with no impurity for deciding the conductivity type and a p layer 6 (thickness: about 10 nm) consisting of microcrystalline silicon (pc-Si) doped with boron is formed on the upper surface of the transparent electrode 3. The n layer 4 and the p layer 6 are examples of the "first non-single-crystalline semiconductor layer" and the "second non-single-crystalline semiconductor layer" in the present invention respectively. The i layer 5 is an example of the "third non-single-crystalline semiconductor layer" in the present invention. Another transparent electrode 7 having a thickness of about 80 nm is formed on the upper surface of the power generation unit. Collectors 8 of silver paste are formed on prescribed portions of the upper surface of the transparent electrode 7. Thus constituted is the photoelectric conversion device according to the first embodiment, employing microcrystalline silicon (μc-Si) as a photoelectric conversion layer (the power generation unit).

Figure 2:
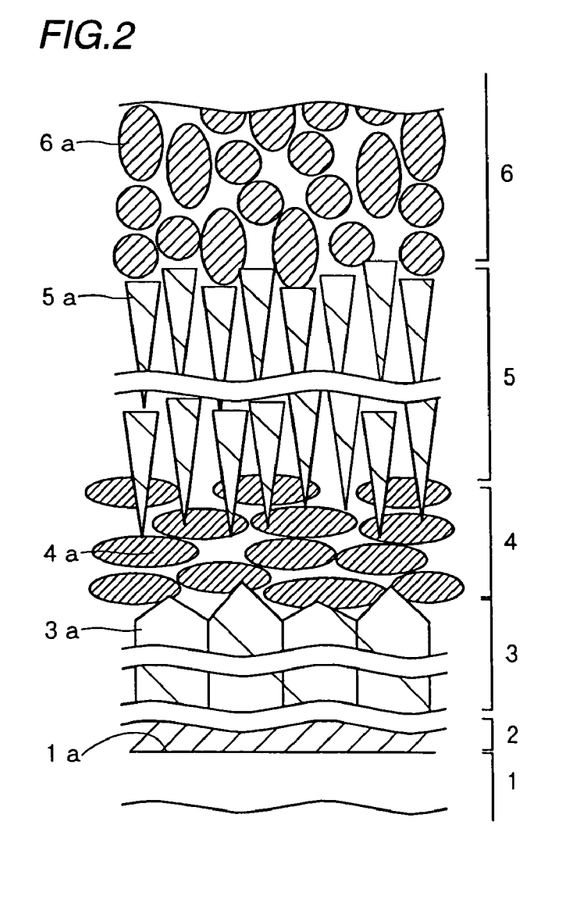
FIG. 2 is a schematic sectional view for illustrating the states of crystal grains contained in layers of the photoelectric conversion device according to the first embodiment shown in FIG. 1.

Referring to FIG. 2, many of crystal grains 4a contained in the n layer 4 have major axes substantially parallel to the main surface 1a of the substrate 1 in the states of crystal grains contained in the layers of the photoelectric conversion device according to the first embodiment. Many of crystal grains 5a contained in the i layer 5 have major axes substantially perpendicular to the main surface 1a of the substrate 1. Further, many of crystal grains 6a contained in the p layer 6 have substantially isotropic shapes or major axes substantially perpendicular to the main surface 1a of the substrate 1. Thus, the crystal grains 4a and 5a are discontinuous and the ratio of grain boundaries as viewed from the i layer 5 is reduced on the interface between the n layer 4 and the i layer 5. Therefore, a reverse leakage current hardly flows on the interface between the n layer 4 and the i layer 5, whereby an open-circuit voltage can conceivably be improved. Further, many of crystal grains 3a contained in the transparent electrode 3 have major axes substantially perpendicular to the main surface 1a of the substrate 1. Thus, the crystal grains 3a and 4a are also discontinuous on the interface between the n layer 4 and the transparent electrode 3, whereby the reverse leakage current is suppressed and the open-circuit voltage can conceivably be further improved as a result.

The following comparative experiment was made in order to confirm the effects of the aforementioned first embodiment. First, n layers 4, i layers 5 and p layers 6 were successively stacked on the upper surfaces of transparent electrodes 3 by plasma CVD under conditions shown in Table 1, thereby preparing samples of the photoelectric conversion device according to the first embodiment and a comparative photoelectric conversion device. In the comparative sample, the i layer 5 and the p layer 6 were formed under the same conditions as those for the sample according to the first embodiment while only the n layer 4 was formed under different conditions.

TABLE 1

| Forming Condition | Substrate Temperature (° C.) | Reaction Pressure (Pa) | High-Frequency Power (W) | Gas Flow Rate (sccm) | |
|---|---|---|---|---|---|
| n Layer (First Embodiment) | 160 | 35 | 100 | SiH$_4$<br>H$_2$<br>PH$_3$ | 3<br>100<br>0.2 |
| n Layer (Comparative Example) | 160 | 35 | 50 | SiH$_4$<br>H$_2$<br>PH$_3$ | 1<br>200<br>0.2 |
| i Layer | 200 | 150 | 50 | SiH$_4$<br>H$_2$ | 20<br>400 |
| p Layer | 160 | 35 | 10 | SiH$_4$<br>H$_2$<br>B$_2$H$_6$ | 3<br>300<br>0.05 |

Sections of the n layers 4 having thicknesses of about 50 nm prepared under the conditions shown in Table 1 were observed with a TEM (transmission electron microscope) for making measurement as to the shapes of crystal grains. Table 2 shows the results. Referring to Table 2, the numerical values indicate average measured values, and directions are those with respect to main surfaces 1a of substrates 1.

TABLE 2

| | Crystal Grain Size (Parallel Direction) | Crystal Grain Size (Perpendicular Direction) |
|---|---|---|
| n Layer (First Embodiment) | 15 nm | 7 nm |
| n Layer (Comparative Example) | 7 nm | 7 nm |

It has been recognized from Table 2 that many of crystal grains contained in the n layer 4 of the sample according to the first embodiment had major axes substantially parallel to the main surface 1a of the substrate 1. It has also been recognized that many of crystal grains contained in the n layer 4 of the comparative sample had substantially isotropic shapes.

Sections of the i layers 5 formed under the conditions shown in Table 1 were also observed with a TEM, to recognize that crystal grains having sizes of at least about 20 nm on the average and about 7 nm on the average were grown perpendicularly and parallelly to the main surfaces 1a of the substrates 1 respectively. In other words, it has been proved that the i layers 5 in the sample according to the first embodiment and the comparative sample had major axes substantially perpendicular to the main surfaces 1a of the substrates 1. While the average grain size of the crystal grains 4a contained in the n layer 4 of the sample according to the first embodiment in the direction substantially parallel to the main surface 1a of the substrate 1 is about 15 nm while that of the crystal grains 5a contained in the i layer 5 in the direction substantially parallel to the main surface 1a of the substrate 1 is about 7 nm, whereby the crystal grains 5a perpendicular to the main surface 1a of the substrate 1a are further improved in discontinuity on the interface between the n layer 4 and the i layer 5. Thus, the reverse leakage current is further suppressed, to conceivably further improve the open-circuit voltage.

In order to confirm the aforementioned effects of the first embodiment, output characteristics of the sample according to the first embodiment and the comparative sample were measured under pseudo-solar irradiation conditions of AM 1.5, 100 mW/cm$^2$ and 25° C. The abbreviation AM (air mass) stands for the ratio of the path of direct sunlight incident upon the earth's atmosphere to the path of sunlight perpendicularly incident upon the standard atmosphere (standard atmospheric pressure: 1013 hPa). Table 3 shows the results.

TABLE 3

| | Open-Circuit Voltage (V) | Short-Circuit Current (mA/cm$^2$) | Curve Factor | Conversion Efficiency (%) |
|---|---|---|---|---|
| First Embodiment | 0.53 | 22.5 | 0.72 | 8.6 |
| Comparative Example | 0.49 | 23.0 | 0.70 | 7.9 |

It has been proved from Table 3 that the sample of the photoelectric conversion device according to the first embodiment, equivalent to the comparative sample as to a short-circuit current, was improved in open-circuit voltage and curve factor as compared with the comparative sample. Thus, it is understood that conversion efficiency is improved according to the first embodiment.

Second Embodiment

In a photoelectric conversion device according to a second embodiment of the present invention, the distribution of crystal grains 19a and 20a is discontinuous in a p layer 16, dissimilarly to the aforementioned first embodiment. The structure of the photoelectric conversion device according to the second embodiment is now described with reference to FIG. 3.

Figure 3:
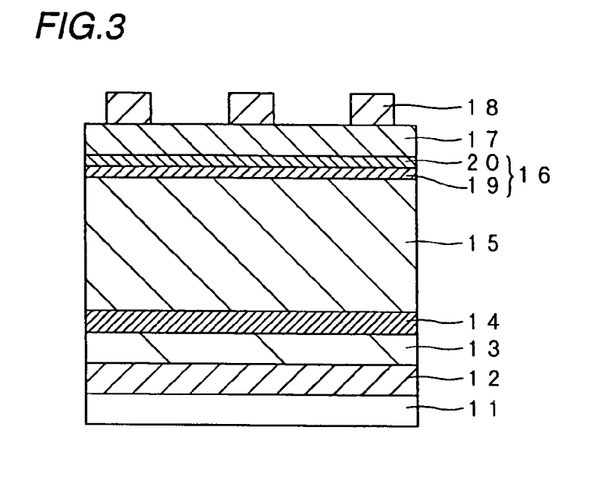
FIG. 3 is a sectional view showing a photoelectric conversion device according to a second embodiment of the present invention.

As shown in FIG. 3, a metal electrode layer 12 of Ag having a thickness of about 300 nm is formed on the upper surface of a glass substrate 11. A transparent electrode 13 of AZO having a thickness of about 100 nm is formed on the upper surface of the metal electrode layer 12. The transparent electrode 13 is an example of the "electrode layer" in the present invention. A power generation unit obtained by successively stacking an n layer 14 (thickness: about 50 nm) consisting of microcrystalline silicon (μ-Si) doped with phosphorus, an i layer 15 (thickness: about 2 μm) consisting of microcrystalline silicon (μc-Si) substantially doped with no impurity for deciding the conductivity type and the p layer 16 (thickness: about 10 nm) consisting of microcrystalline silicon (μc-Si) doped with boron is formed on the upper surface of the transparent electrode 13. The n layer 14 and the p layer 16 are examples of the "first non-single-crystalline semiconductor layer" and the "second non-single-crystalline semiconductor layer" in the present invention respectively. The i layer 15 is an example of the "third non-single-crystalline semiconductor layer" in the present invention.

According to the second embodiment, the p layer 16 is constituted of a p2 layer 19 in contact with the upper surface of the i layer 15 and a p1 layer 20 formed on the upper surface of the p2 layer 19. The p2 layer 19 and the p1 layer 20 are examples of the "first layer" and the "second layer" in the present invention respectively.

A transparent electrode 17 having a thickness of about 80 nm is formed on the upper surface of the power generation unit. Collectors 18 of silver paste are formed on prescribed portions of the upper surface of the transparent electrode 17. Thus constituted is the photoelectric conversion device according to the second embodiment employing microcrystalline silicon (μc-Si) as a photoelectric conversion layer (the power generation unit).

Figure 4:
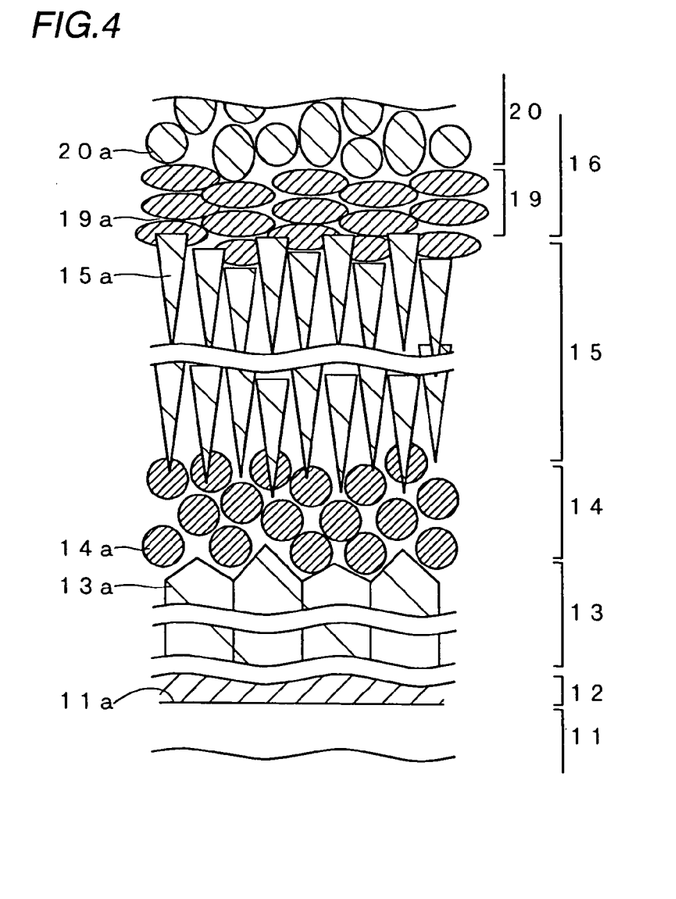
FIG. 4 is a schematic sectional view for illustrating the states of crystal grains contained in layers of the photoelectric conversion device according to the second embodiment shown in FIG. 3.

Referring to FIG. 4, many of crystal grains 14a contained in the n layer 14 have substantially isotropic shapes in the states of crystal grains contained in the layers of the photoelectric conversion device according to the second embodiment. Many of crystal grains 15a contained in the i layer 15 have major axes substantially perpendicular to the main surface 11a of the substrate 11. Many of the crystal grains 20a contained in the p1 layer 20 have substantially isotropic shapes or major axes substantially perpendicular to the main surface 11a of the substrate 11, while many of the crystal grains 19a contained in the p2 layer 19 have major axes substantially parallel to the main surface 11a of the substrate 11.

Thus, the distribution of the crystal grains 15a, 16a, 19a and 20a is discontinuous not only on the interface between the i layer 15 and the p layer 16 but also on the interface between the p2 layer 19 and the p1 layer 20, whereby the numbers of grain boundaries perpendicular to the main surface 11a of the substrate 11, conceivably forming a path for a reverse leakage current in the photoelectric conversion device, are conceivably reduced on the respective interfaces. Consequently, the reverse leakage current is further suppressed, to conceivably further improve the open-circuit voltage.

In order to confirm the effects according to the aforementioned second embodiment, the following experiment was made: A sample of the photoelectric conversion device according to the second embodiment was prepared by successively stacking an n layer 14, an i layer 15, a p2 layer 19 and a p1 layer 20 on the upper surface of a transparent electrode layer 13 by plasma CVD under conditions shown in Table 4.

TABLE 4

| Forming Condition | Substrate Temperature (° C.) | Reaction Pressure (Pa) | High-Frequency Power (W) | Gas Flow Rate (sccm) | | | |
|---|---|---|---|---|---|---|---|
| | | | | SiH$_4$ | H$_2$ | B$_2$H$_6$ | PH$_3$ |
| n Layer | 150 | 35 | 50 | 1 | 200 | — | 0.02 |
| i Layer | 200 | 150 | 50 | 20 | 400 | — | — |
| p2 Layer | 120 | 150 | 50 | 2 | 200 | 0.01 | — |
| p1 Layer | 120 | 150 | 40 | 3 | 300 | 0.02 | — |

Then, output characteristics of the sample of the photoelectric conversion device according to the second embodiment were measured under pseudo-solar irradiation conditions of AM 1.5, 100 mW/cm$^2$ and 25° C. Table 5 shows the results.

TABLE 5

| | Open-Circuit Voltage (V) | Short-Circuit Current (mA/cm$^2$) | Curve Factor | Conversion Efficiency (%) |
|---|---|---|---|---|
| Second Embodiment | 0.51 | 22.9 | 0.73 | 8.5 |

It is understood from Table 5 that the sample of the photoelectric conversion device according to the second embodiment was improved in open-circuit voltage and curve factor as well as in conversion efficiency as compared with the sample of the comparative photoelectric conversion device for the first embodiment shown in Table 3. It has been possible to confirm that the sample according to the second embodiment obtained characteristics equivalent to those of the sample according to the first embodiment.

Figure 5:
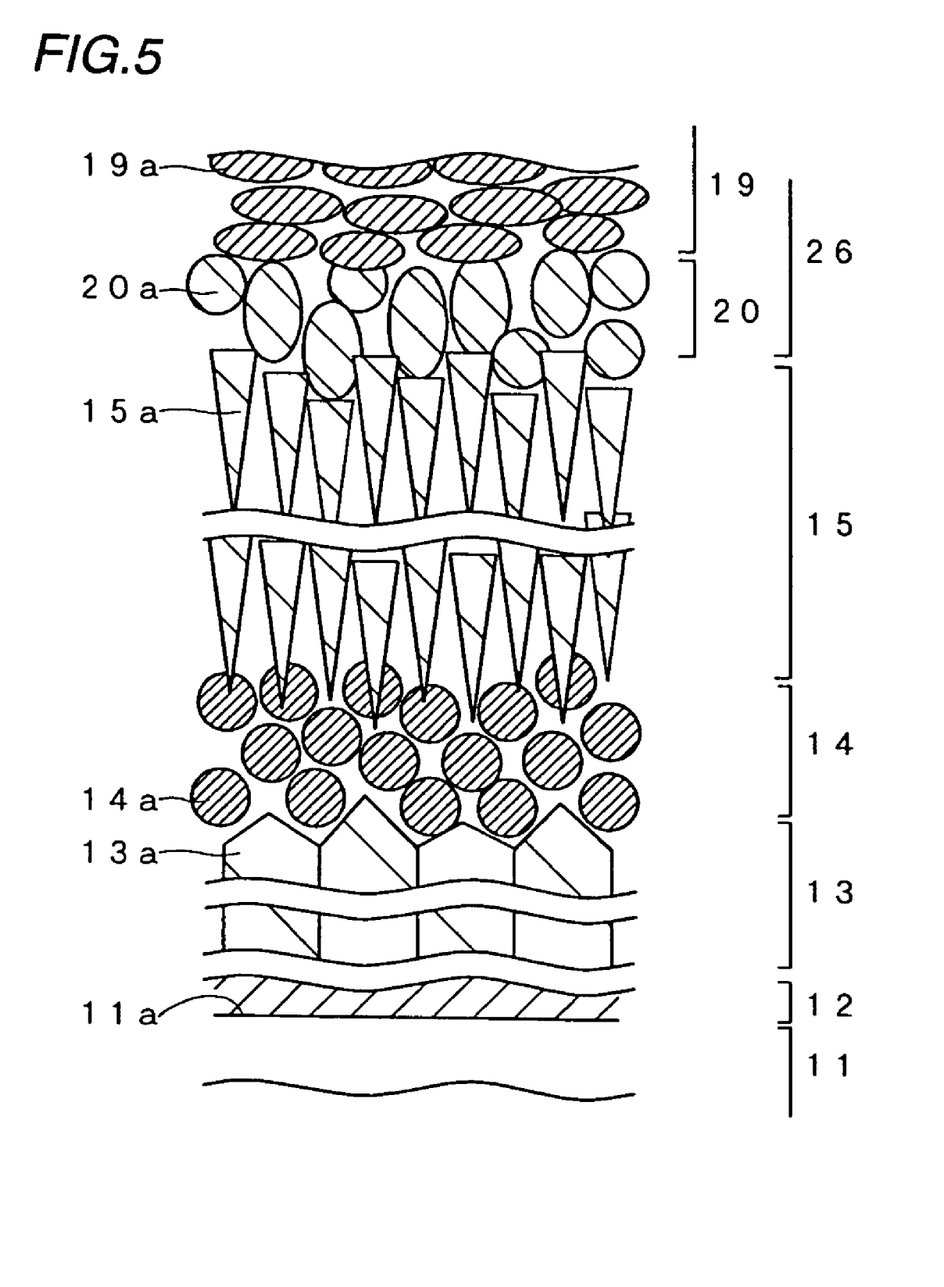
FIG. 5 is a schematic sectional view for illustrating the states of crystal grains contained in layers of a photoelectric conversion device according to a modification of the second embodiment shown in FIG. 3.

FIG. 5 is a schematic sectional view for illustrating the states of crystal grains contained in layers of a photoelectric conversion device according to a modification of the second embodiment shown in FIG. 3. Referring to FIG. 5, a p1 layer 20 constituting a p layer 26 is in contact with an i layer 15 in this modification of the second embodiment, dissimilarly to the aforementioned second embodiment. Many of crystal grains 20a contained in the p1 layer 20 have substantially isotropic shapes or major axes substantially perpendicular to a main surface 11a of a substrate 11 while many of crystal grains 19a contained in a p2 layer 19 have major axes substantially parallel to the main surface 11a of the substrate 11, similarly to the second embodiment. Thus, the distribution of the crystal grains 19a and 20a is discontinuous on the interface between the p1 layer 20 and the p2 layer 19 similarly to the second embodiment, whereby the number of grain boundaries perpendicular to the main surface 11a of the substrate 11, conceivably forming a path for a reverse leakage current in the photoelectric conversion device, is conceivably reduced on this interface. Consequently, the reverse leakage current is suppressed, thereby conceivably improving an open-circuit voltage.

Although the present invention has been described and illustrated in detail, it is clearly understood that the same is by way of illustration and example only and is not to be taken by way of limitation, the spirit and scope of the present invention being limited only by the terms of the appended claims.

For example, the main surface 1a or 11a of the substrate 1 or 11, having a substantially planar shape in each of the aforementioned embodiments, may alternatively have an irregular shape. In this case, the major axes of crystal grains contained in the layers may be substantially perpendicular or substantially parallel to the irregular main surface. In other words, grain boundaries substantially parallel to the film thickness direction (perpendicular direction) may be discontinuous since a current flows substantially along the film thickness direction in the photoelectric conversion device.

While the major axis directions of the crystal grains contained in the layers deviate by about 90° from each other in each of the aforementioned embodiments, the present invention is not restricted to this but the major axis directions of the crystal grains contained in the layers preferably deviate by about 30° from each other.

While the photoelectric conversion device according to each of the aforementioned embodiments has the single power generation unit, the present invention is not restricted to this but at least one power generation unit may be formed by the power generation unit according to each of the aforementioned embodiments in the so-called multilayer photovoltaic device obtained by stacking a plurality of power generation units. Thus, the number of grain boundaries perpendicular to a main surface of a substrate is reduced at least in one power generation unit, whereby a reverse leakage current can be suppressed. Consequently, an open-circuit voltage can be improved.

While each of the above embodiments has been described with reference to a photoelectric conversion device consisting of microcrystalline silicon (μc-Si), the present invention is not restricted to this but the photoelectric conversion device may alternatively consist of another semiconductor material such as SiGe or SiC.

What is claimed is:

1. A photoelectric conversion device comprising:
   a substrate having a main surface;
   a first conductivity type first non-single crystalline semiconductor layer formed on said main surface of said substrate;
   a second conductivity type second non-single crystalline semiconductor layer formed on said main surface of said substrate; and
   a substantially intrinsic third non-single-crystalline semiconductor layer formed between said first non-single-crystalline semiconductor layer and said second non-single-crystalline semiconductor layer, wherein
   many of crystal grains contained in said third non-single-crystalline semiconductor layer have major axes substantially perpendicular to said main surface of said substrate on an interfacial portion between said third non-single crystalline semiconductor layer and at least either said first non-single-crystalline semiconductor layer or said second non-single-crystalline semiconductor layer, and
   many of crystal grains contained in either said first non-single-crystalline semiconductor layer or said second non-single-crystalline semiconductor layer have major axes substantially parallel to said main surface of said substrate on said interfacial portion.

2. The photoelectric conversion device according to claim 1, wherein
   the average grain size of said crystal grains contained in said either said first non-single-crystalline semiconductor layer or said second non-single-crystalline semiconductor layer in the direction parallel to said main surface of said substrate is larger than the average grain size of said crystal grains contained in said third non-single-crystalline semiconductor layer in the direction parallel to said main surface of said substrate.

3. The photoelectric conversion device according to claim 1, wherein
   said first non-single-crystalline semiconductor layer, said second non-single-crystalline semiconductor layer and said third non-single-crystalline semiconductor layer consist of microcrystalline semiconductor layers.

4. The photoelectric conversion device according to claim 3, wherein
   said first non-single-crystalline semiconductor layer, said second non-single-crystalline semiconductor layer and said third non-single-crystalline semiconductor layer consist of microcrystalline silicon layers.

5. The photoelectric conversion device according to claim 1, further comprising an electrode layer formed between said substrate and either said first non-single-crystalline semiconductor layer or said second non-single-crystalline semiconductor layer to come into contact with either said first non-single-crystalline semiconductor layer or said second non-single-crystalline semiconductor layer, wherein
   many of crystal grains contained in said electrode layer have major axes substantially perpendicular to said main surface of said substrate.

6. The photoelectric conversion device according to claim 5, wherein said electrode layer is a transparent electrode layer.

7. The photoelectric conversion device according to claim 6, wherein said transparent electrode layer consists of AZO.

8. The photoelectric conversion device according to claim 1, including at least one power generation unit having said first non-single-crystalline semiconductor layer, said second non-single-crystalline semiconductor layer and said third non-single-crystalline semiconductor layer.

9. A photoelectric conversion device comprising:
   a substrate having a main surface;
   a first conductivity type first non-single-crystalline semiconductor layer formed on said main surface of said substrate;
   a second conductivity type second non-single-crystalline semiconductor layer formed on said main surface of said substrate; and
   a substantially intrinsic third non-single-crystalline semiconductor layer formed between said first non-single-crystalline semiconductor layer and said second non-single-crystalline semiconductor layer on said main surface of said substrate, wherein
   at least either said first non-single-crystalline semiconductor layer or said second non-single-crystalline semiconductor layer includes a structure formed by stacking a first layer and a second layer containing many crystal grains having major axis directions substantially different from each other,
   many of crystal grains contained in said first layer have major axes substantially parallel to said main surface of said substrate, and
   many of crystal grains contained in said second layer have major axes substantially perpendicular to said main surface of said substrate.

10. The photoelectric conversion device according to claim 9, wherein
    said first layer is in contact with said third non-single-crystalline semiconductor layer, and
    many of crystal grains contained in said third non-single-crystalline semiconductor layer have major axes substantially perpendicular to said main surface of said substrate.

11. The photoelectric conversion device according to claim 9, wherein
said second layer is in contact with said third non-single-crystalline semiconductor layer.

12. The photoelectric conversion device according to claim 9, wherein
the average grain size of said crystal grains contained in said first layer in the direction parallel to said main surface of said substrate is larger than the average grain size of said crystal grains contained in said second layer in the direction parallel to said main surface of said substrate.

13. The photoelectric conversion device according to claim 9, wherein
said first non-single-crystalline semiconductor layer, said second non-single-crystalline semiconductor layer and said third non-single-crystalline semiconductor layer consist of microcrystalline semiconductor layers.

14. The photoelectric conversion device according to claim 13, wherein
said first non-single-crystalline semiconductor layer, said second non-single-crystalline semiconductor layer and said third non-single-crystalline semiconductor layer consist of microcrystalline silicon layers.

15. The photoelectric conversion device according to claim 9, further comprising an electrode layer formed between said substrate and either said first non-single-crystalline semiconductor layer or said second non-single-crystalline semiconductor layer to come into contact with either said first non-single-crystalline semiconductor layer or said second non-single-crystalline semiconductor layer, wherein many of crystal grains contained in said electrode layer have major axes substantially perpendicular to said main surface of said substrate.

16. The photoelectric conversion device according to claim 15, wherein said electrode layer is a transparent electrode layer.

17. The photoelectric conversion device according to claim 16, wherein said transparent electrode layer consists of AZO.

18. The photoelectric conversion device according to claim 9, including at least one power generation unit having said first non-single-crystalline semiconductor layer, said second non-single-crystalline semiconductor layer and said third non-single-crystalline semiconductor layer.

* * * * *